United States Patent [19]
Kim

[11] Patent Number: 5,804,339
[45] Date of Patent: Sep. 8, 1998

[54] FIDELITY RATIO CORRECTED PHOTOMASKS AND METHODS OF FABRICATING FIDELITY RATIO CORRECTED PHOTOMASKS

[75] Inventor: Jin-min Kim, Kyungki-do, Rep. of Korea

[73] Assignee: Samsung Electronics Co., Ltd., Kyungki-do, Rep. of Korea

[21] Appl. No.: 754,685

[22] Filed: Nov. 21, 1996

[30] Foreign Application Priority Data

Jul. 16, 1996 [KR] Rep. of Korea .................. 96-28880

[51] Int. Cl.⁶ ........................................... G03F 9/00
[52] U.S. Cl. ................................. 430/5; 430/394
[58] Field of Search ........................ 430/5, 394, 322, 430/324

[56] References Cited

U.S. PATENT DOCUMENTS 5,082,762  1/1992  Takahashi ........................ 430/5
5,532,090  7/1996  Borodovsky ..................... 430/394

Primary Examiner—S. Rosasco
Attorney, Agent, or Firm—Myers Bigel Sibley & Sajovec, P.A.

[57] ABSTRACT

Methods of fabricating a photomask including a correction exposure utilizing a correction exposure mask. The methods include exposing a photoresist with an activating agent utilizing a predetermined exposure pattern with a first exposure dosage. The photoresist is also exposed with a correction exposure dosage of an activating agent using a correction exposure pattern. The correction exposure dosage is less than the first exposure dosage. The correction exposure pattern may include a portion of the predetermined exposure pattern having a low pattern fidelity ratio. Photomasks fabricated according to the methods of the present invention are also provided.

10 Claims, 4 Drawing Sheets

FIDELITY RATIO CORRECTED PHOTOMASKS AND METHODS OF FABRICATING FIDELITY RATIO CORRECTED PHOTOMASKS

FIELD OF THE INVENTION

The present invention relates to methods of fabricating a photomask and more particularly to methods for fabricating a photomask used for photolithography process.

BACKGROUND OF THE INVENTION

In the fabrication of semiconductor devices photomask patterns are often formed by photolithography techniques. In photolithography, a photoresist material is utilized which has different solubilities based upon its exposure to an activating agent. Thus, a photoresist may have different solubility where the photoresist has been exposed to light such as X-ray or ultraviolet light. A mask for patterning materials such as semiconductor material, insulating material or conductive material may be formed by selectively exposing portions of a photoresist layer formed on the semiconductor, insulating or conductive materials to an activating agent to alter the solubility of the exposed portions of the photoresist material. The more soluble portion of the photoresist is then removed to create a photomask pattern of the photoresist material which exposes portions of the material on which the photoresist is formed. These exposed portions of the underlying material may then be etched or otherwise processed as part of the fabrication process of the semiconductor device.

Increases in the integration density of semiconductor devices has generally brought about a need for methods of forming finer and finer patterns of photomasks. Some responses to this need have included, using electron beams, ion beams or X-rays as the activating agent of the photoresist material. Modified exposure methods using diffracted light have also been investigated. New photoresist materials and new photoresist material handling methods have also been investigated.

One measure of the controllability of a photomask fabrication process, and therefore, the degree to which the process is capable of producing fine patterns, is the pattern fidelity ratio. The pattern fidelity ratio is the ratio of the actual pattern area finally formed on the photomask with respect to the originally designed pattern area. To increase the pattern fidelity ratio, a method of correcting proximity effect using optical proximity correction (OPC), or a dummy pattern of dummy lined contact (DLC) has been used. However, using a lithography device which uses a 10 KeV accelerating voltage (which is widely used at present), it is difficult to form a precise pattern. It is particularly difficult to form a precise pattern in the case of a contact pattern having a size of 1.0 $\mu$m or below. In such a case utilizing previous methods, it is typically difficult to secure linearity of a critical dimension (CD).

Accordingly, improvements are needed in methods of fabricating photomasks.

SUMMARY OF THE INVENTION

In view of the above, it is an object of the present invention to provide methods of fabricating a photomask which improves the pattern fidelity ratio of the photomask.

A further object of the present invention is to provide increasingly fine photomasks.

These and other objects of the present invention are provided by methods of fabricating a photomask using a correction exposure and a correction mask to compensate for areas of low pattern fidelity ratio in the original exposure pattern. In particular, the methods of the present invention include exposing a photoresist with an activating agent utilizing a predetermined exposure pattern with a first exposure dosage. The photoresist is also exposed with a correction exposure dosage of an activating agent using a correction exposure pattern. The correction exposure dosage is less than the first exposure dosage. In particular embodiments of the present invention, correction exposure doses of greater than about 0.75% of the first exposure dosages may be used. The correction exposure pattern may include a portion of the predetermined exposure pattern having a low pattern fidelity ratio.

By providing a correction exposure of the pattern, the pattern fidelity ratio of the photomask may be increased. By incorporating the portions of the predetermined exposure pattern of the photomask which have a low pattern fidelity ratio into the correction mask an additional exposure dosage may be provided to these low ratio areas. Thus, the pattern fidelity ratio of these particular areas of the photomask may be increased.

In a particular embodiment of the present invention, the predetermined exposure pattern includes at least one of a contact pattern and a dummy line pattern. Furthermore, the portion of the predetermined exposure pattern included in the correction exposure pattern may include an edge portion of the predetermined exposure pattern or a corner portion of the predetermined exposure pattern.

In an alternative embodiment of the present invention the photoresist is exposed to a dosage of an activating agent utilizing a second correction exposure mask.

In particular embodiments of the present invention, the activating agent in the first exposure dosage and the activating agent in the correction exposure dosage are the same type of activating agent. Furthermore, the activating agent utilized in the third exposure dosage may be a different type of agent from the activating agent utilized in the correction exposure dosage.

Photomasks fabricated according to the methods of the present invention are also provided.

BRIEF DESCRIPTION OF THE DRAWINGS

The objects and advantages of the present invention will become more apparent by describing in detail preferred embodiments thereof with reference to the attached drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention will now be described with respect to FIGS. 1 through 5 which represent various exposure patterns of corrected photomasks according to the present invention. As will be appreciated by those of skill in the art, the patterns illustrated in FIGS. 1 through 5 are provided for illustration purposes only and may, therefore, not be to scale. Furthermore, other patterns may be utilized while still benefiting from the teachings of the present invention.

Figure 1:
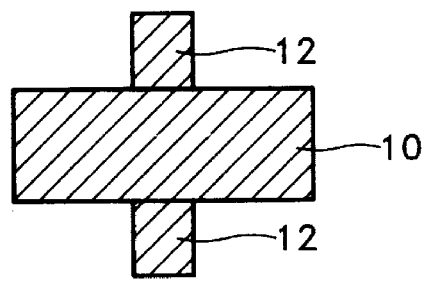
FIG. 1 is a diagram illustrating an exposure pattern used for forming a photomask.

FIG. 1 illustrates an exposure pattern for use in a photolithographic process. The exposure pattern of FIG. 1 shows the pattern in which a photoresist is exposed to an activating agent which alters the solubility of the photoresist material. Examples of suitable activating agents include light, such as ultraviolet light or Xrays, electron or ion beams. As will be appreciated by one of skill in the art, any number of activating agents and photoresist materials known to those of skill in the art may be utilized while still benefiting from the teachings of the present invention. The predetermined exposure pattern of FIG. 1 is designed to have a shape which corresponds to the desired shape of the photomask to be produced. As is illustrated in FIG. 1, the exposure pattern may include a contact pattern 10 for forming a contact hole and a dummy line pattern 12 formed around the contact pattern 10.

Figure 2:
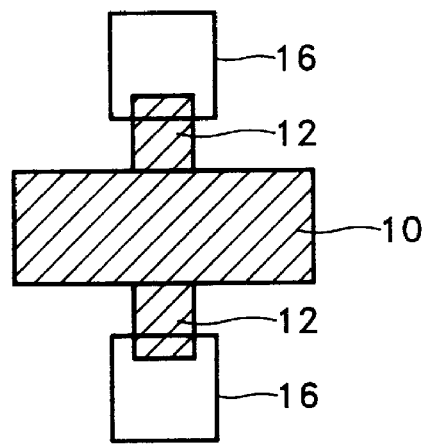
FIG. 2 is a diagram illustrating a correction exposure pattern used in a correction exposure process according to a first embodiment of the present invention.

FIG. 2 illustrates an exposure pattern for a correction exposure used as a second exposure of the photoresist to an activating agent. For the predetermined exposure pattern of FIG. 1, a correction exposure may be performed using the correction exposure pattern 16. The correction exposure pattern preferably includes portions of the predetermined exposure pattern where the fidelity ratio is low. Thus, the correction exposure pattern 16 preferably includes portions of the contact pattern 10 or the dummy line pattern 12 where these patterns have a low fidelity ratio. In the embodiment shown in FIG. 2, the portions of the predetermined exposure pattern included in the correction exposure pattern are the ends of the dummy line pattern 12.

It should be noted that the correction exposure pattern used in the correction exposure is not limited to the configuration of the embodiments described herein. As will be appreciated by those of skill in the art, any number of correction patterns and photomask exposure patterns may be utilized while still benefitting from the teachings of the present invention. Thus, reductions in the pattern fidelity ratio for a photomask pattern may be corrected by subsequent exposures in a correction exposure pattern which includes any region of the predetermined exposure pattern in which the pattern fidelity ratio is expected to be low.

In one embodiment of a method of fabricating a corrected photomask according to the present invention, a first exposure of a first dosage of an activating agent of the photoresist material is provided to the photoresist in a predetermined exposure pattern, such as the exposure pattern illustrated in FIG. 1. For example, a first exposure pattern of an electron beam of a first exposure dosage, e.g. 2.0 $\mu C/cm^2$, may be provided to a photoresist material. After the first exposure a second, correction exposure in a correction exposure pattern, such as that illustrated in FIG. 2, is provided to the photoresist material. This second exposure is preferably of a dosage less than that of the first exposure. For example, the second exposure dosage may correspond to about 0.75% of the first light dosage, about 1.5% of the first dosage or about 2.25% of the first dosage. While the second exposure is described herein as "after" the first exposure, as will be appreciated by those of skill in the art, this second exposure may occur before, during or after the exposure in the photomask pattern so long as an increased cumulative dosage is provided to the common portions of the correction pattern and the predetermined exposure pattern.

Figure 3:
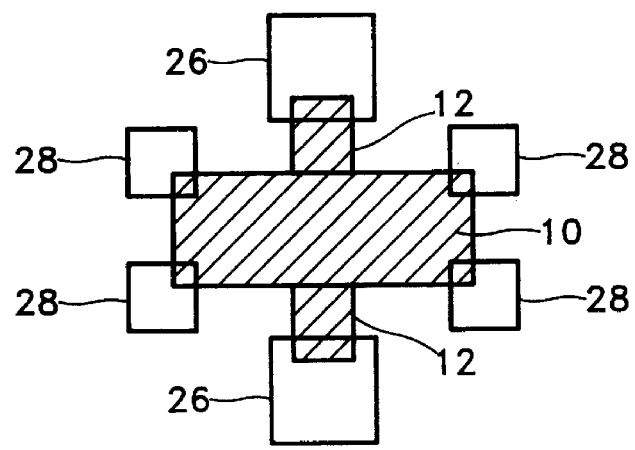
FIG. 3 is a diagram illustrating a correction exposure pattern used in a correction exposure process according to a second embodiment of the present invention.
Figure 4:
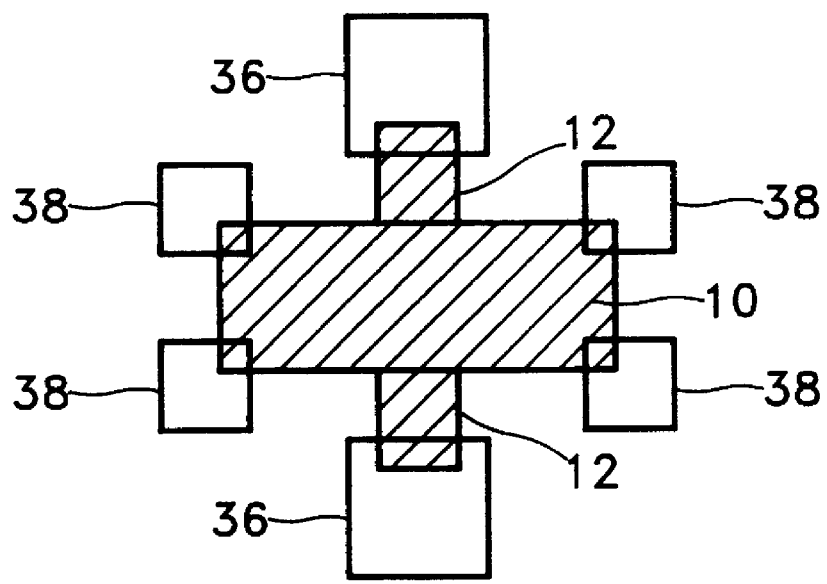
FIG. 4 is a diagram illustrating a correction exposure pattern used in a correction exposure process according to a third embodiment of the present invention.

FIGS. 3 and 4 show alternative correction exposure patterns for use with the exposure pattern of FIG. 1. In order to increase the pattern fidelity ratio of the contact pattern 10 and the dummy line pattern 12, the correction exposure may be performed with a correction exposure pattern which includes the low fidelity ratio portions of the contact pattern 10 and the low fidelity ratio portions of the dummy line pattern 12. As illustrated in FIGS. 3 and 4, the correction exposure pattern may include a first portion 26, 36 of the edges of the dummy line pattern 12 and a second portion 28, 38 which includes portions of the edges of the contact pattern 10. These portions of the correction exposure pattern 26, 36 and 28, 38 may be exposed in a single exposure or in multiple exposures where only a portion of the entire correction exposure pattern is exposed in each exposure. Furthermore, as will be appreciated by those of skill in the art, differing exposures may be provided to different sections of the correction exposure pattern. For example, the portion 26 of the correction exposure pattern may receive a correction exposure dosage of 0.75% of the first exposure dosage and the portion 28 may receive a correction exposure dosage of 1.5% of the first exposure dosage.

Figure 5:
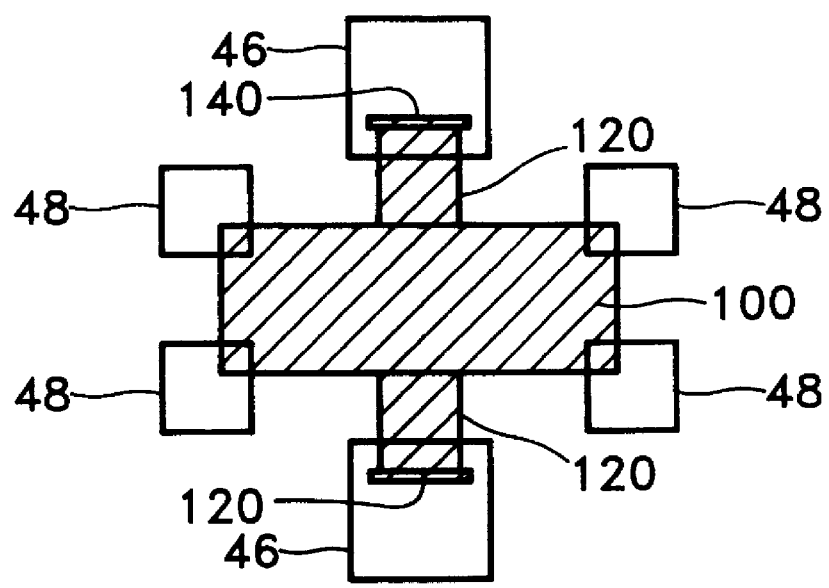
FIG. 5 is a diagram illustrating a correction exposure pattern used in a correction exposure process according to a fourth embodiment of the present invention.

FIG. 5 illustrates an alternative embodiment of the present invention. In the embodiment illustrated in FIG. 5, the first exposure is performed with a predetermined exposure pattern which includes a contact pattern 100 and a dummy line pattern 120. The dummy line pattern 120 has an extended edge region 140 which may be created by providing a third exposure dosage to a second correction pattern, such as by using an electron beam with a predetermined exposure dosage, e.g. 2.0 $\mu C/cm^2$.

Additionally, in order to increase the pattern fidelity ratio of the contact pattern 100 and the dummy line pattern 120, a correction exposure, as described above, is performed with a correction exposure pattern which includes portions 46 and 48. As seen in FIG. 5, the portions 46 and 48 include a portion of the contact pattern 100 and a portion of the dummy line pattern 120 which have a low fidelity ratio. In this embodiment, the correction exposure pattern includes a first correction exposure pattern 46 which includes the extended edge region 140 of the dummy line pattern 120 and a second correction exposure pattern 48 which includes the edges of the contact pattern 100. As with the previously described correction exposure dosages, the correction exposure dosage is preferably less than the first exposure dosage.

Figure 6:
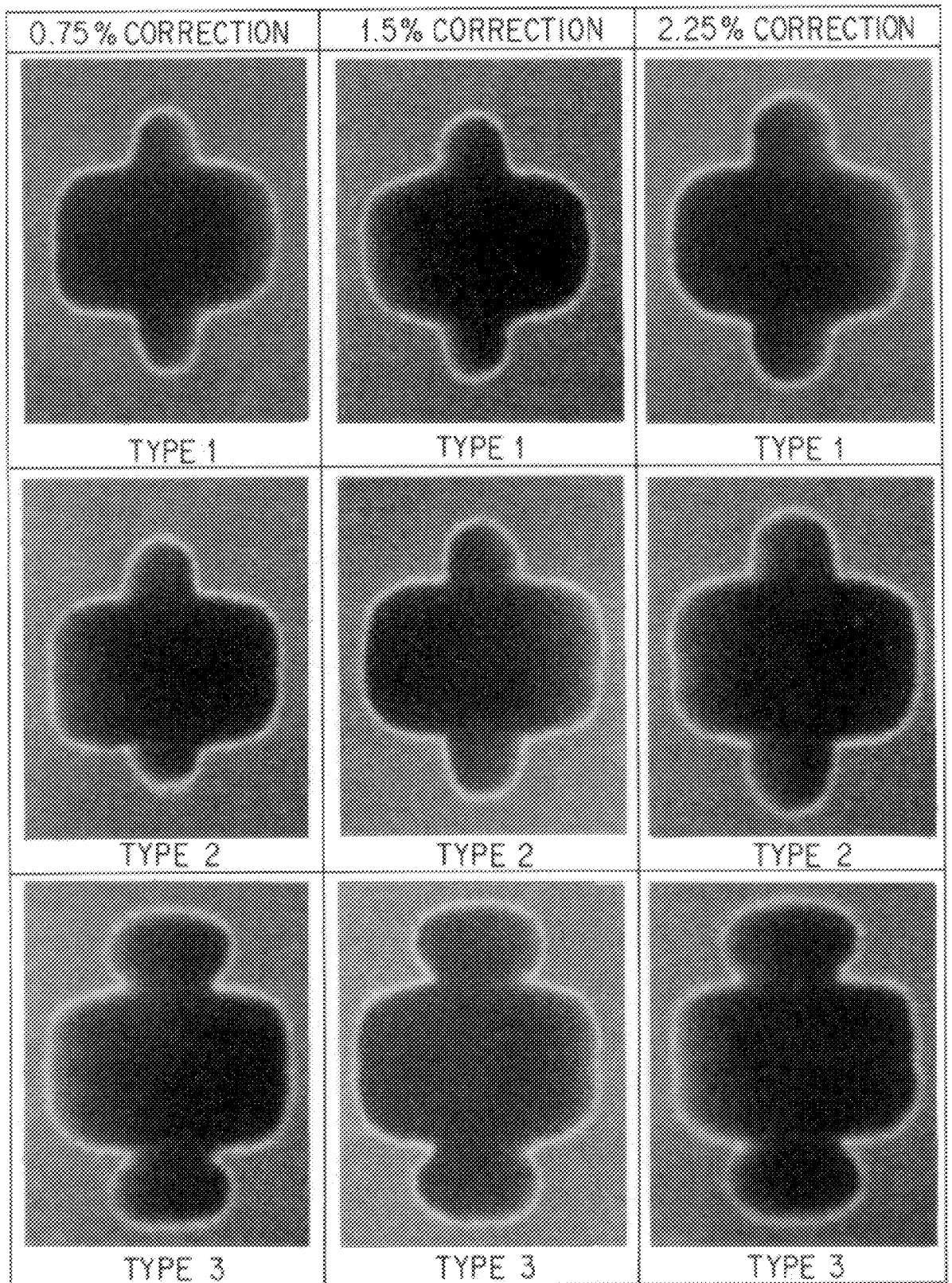
FIG. 6 are photographs of a photomask pattern produced utilizing the methods of the present invention.
Figure 7:
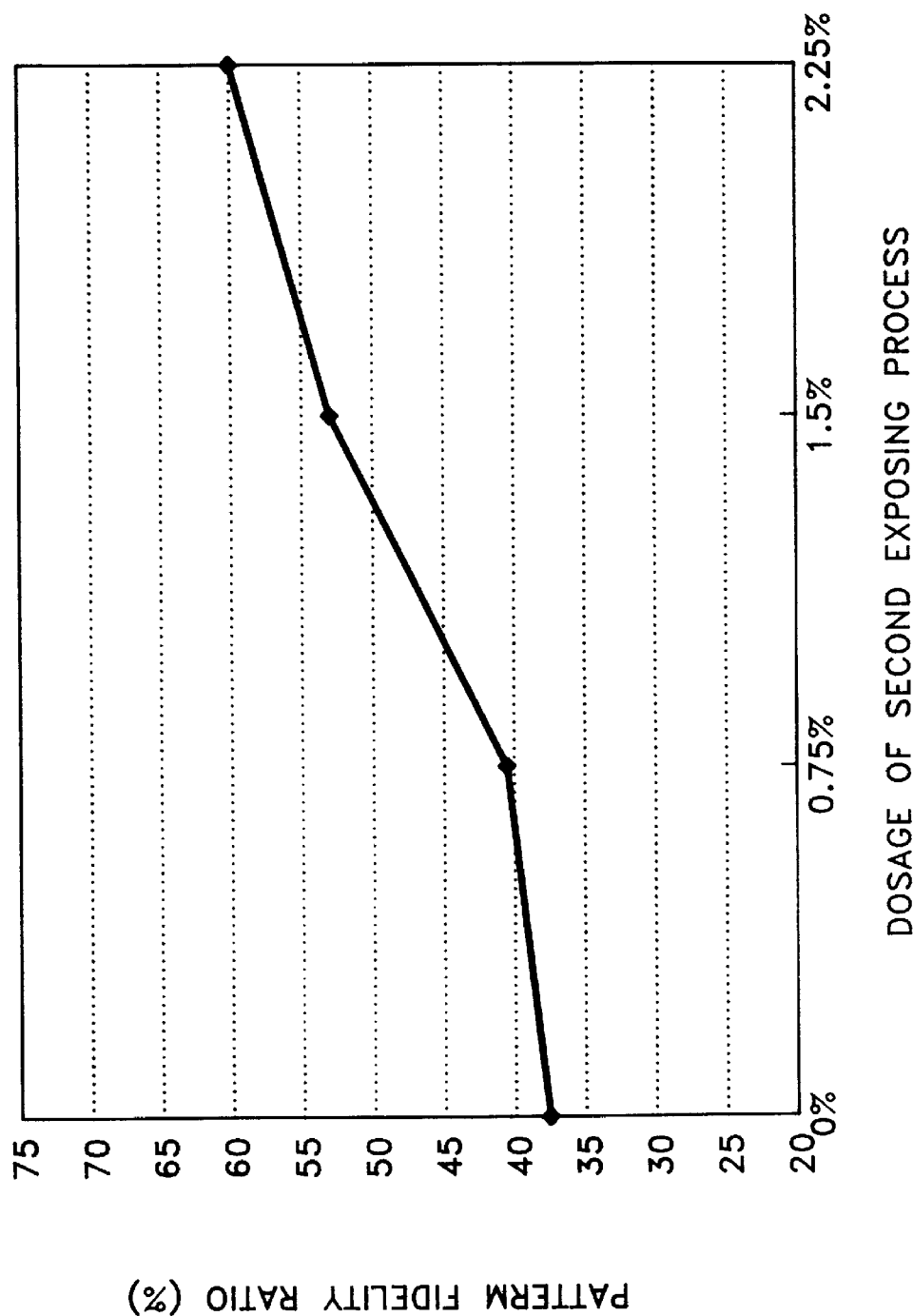
FIG. 7 is a graph showing pattern fidelity ratio with respect to dosages of correction exposures utilizing the methods of the present invention.

The improvements in the fidelity ratio which result from use of the present invention are seen in FIGS. 6 and 7. Referring to FIG. 6, types 1, 2 and 3 show the patterns defined on a photomask when the method of the present invention with the exposure pattern of FIG. 1 and the correction exposure patterns shown in FIGS. 2, 3 and 5, respectively is utilized. For types 1 to 3, a correction dosage of 0.75%, 1.5%, and 2.25% of each first dosage, respectively, was applied. As may be seen in FIG. 6, when a pattern is formed on a photomask utilizing the correction methods of the present invention, the greater the correction dosage used in the correction exposure the better the shape of the dummy line pattern and the shape of edge of the contact pattern defined on the photomask.

FIG. 7 shows the change in pattern fidelity ratio with changes in dosage used in the correction exposure. FIG. 7 plots the change in pattern fidelity ratio as a function of correction dosage. The plotted correction dosages are 0%, 0.75%, 1.5%, and 2.25% of the first dosage. As shown in FIG. 7, when a photomask is manufactured in a conventional manner without an additional correction (corresponding to the 0% point), the pattern fidelity ratio is only 37%. However, when a correction exposure is performed with correction dosages corresponding to 0.75%, 1.5%, or 2.25% of the first dosage, the pattern fidelity ratio increases to 40.5%, 53%, or 60% respectively.

Furthermore, about a 20 to 30% increase in the depth of focus (DOF) margin can be obtained by using a photomask pattern fabricated by the methods according to the present invention. By the additional exposure of the correction exposure, the pattern fidelity is increased which results in a corresponding increase in the DOF margin.

As will be appreciated by those of skill in this art, the preceding embodiments are provided, not to limit or define the scope of the present invention, but to illustrate the nature of the present invention and possible uses for the teachings of the present invention. These embodiments may be modified in many different ways while still obtaining the benefits of the teachings of the present invention. In the drawings and specification, there have been disclosed typical preferred embodiments of the invention and, although specific terms are employed, these terms are used in a generic and descriptive sense only and not for purposes of limitation, the scope of the invention being set forth in the following claims.

That which is claimed:

1. A method of fabricating a photomask, the method comprising the steps of:

exposing a photoresist with an activating agent utilizing a predetermined exposure pattern with a first exposure dosage; and exposing the photoresist to a correction exposure dosage of activating agent using a correction exposure pattern, wherein the correction exposure dosage is from about 0.75% to about 2.25% of the first exposure dosage and wherein the correction exposure pattern includes a portion of the predetermined exposure pattern and wherein the portion of the predetermined exposure pattern includes a portion having a low pattern fidelity ratio.

2. A method of fabricating a photomask according to claim 1 wherein the predetermined exposure pattern includes at least one of a contact pattern and a dummy line pattern.

3. A method of fabricating a photomask according to claim 1, wherein the portion of the predetermined exposure pattern included in the correction exposure pattern comprises an edge portion of the correction exposure pattern.

4. A method of fabricating a photomask according to claim 1, wherein the portion of the predetermined exposure pattern included in the correction exposure pattern comprises a corner portion of the correction exposure pattern.

5. A method of fabricating a photomask according to claim 1, further comprising the step of exposing the photoresist to an exposure dosage of an activating agent utilizing a second correction exposure mask.

6. A method of fabricating a photomask according to claim 5, wherein the activating agent utilized in the third exposure dosage comprises a different type of agent from the activating agent utilized in the correction exposure dosage.

7. A method of fabricating a photomask according to claim 1, wherein the activating agent in the first exposure dosage and the activating agent in the correction exposure dosage comprise the same type of activating agent.

8. A photomask fabricated according to the method of fabricating a photomask according to claim 1.

9. A high fidelity exposure method for a fabricating a photomask including a plurality of lines, the exposure method comprising double exposing only the corners of at least one of the plurality of lines.

10. A high fidelity exposure method for fabricating a photomask including a plurality of lines, the exposure method comprising double exposing the ends of at least one of the plurality of lines wherein a second exposure is from about 0.75% to about 2.25% a first exposure.

* * * * *